US 7,009,260 B2

(12) United States Patent
Park

(10) Patent No.: US 7,009,260 B2
(45) Date of Patent: Mar. 7, 2006

(54) WELL STRUCTURE IN HIGH VOLTAGE DEVICE

(75) Inventor: Sung Kee Park, Sangjoo-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 88 days.

(21) Appl. No.: 10/730,299

(22) Filed: Dec. 8, 2003

(65) Prior Publication Data

US 2004/0178469 A1    Sep. 16, 2004

(30) Foreign Application Priority Data

Mar. 12, 2003    (KR)    ....................... 10-2003-0015373

(51) Int. Cl.
*H01L 29/76*    (2006.01)
*H01L 29/94*    (2006.01)
(52) U.S. Cl. ...................... 257/371; 257/509
(58) Field of Classification Search ............... 257/371, 257/509
See application file for complete search history.

(56) References Cited

U.S. PATENT DOCUMENTS

| 4,804,637 | A | * | 2/1989 | Smayling et al. | ........... 438/264 |
| 5,627,398 | A | * | 5/1997 | Zlebir et al. | ................ 257/427 |
| 5,856,215 | A | * | 1/1999 | Jung | .......................... 438/199 |

* cited by examiner

*Primary Examiner*—Phat X. Cao
*Assistant Examiner*—Theresa T. Doan
(74) *Attorney, Agent, or Firm*—Marshall, Gerstein & Borun LLP

(57) ABSTRACT

A well structure in a high voltage device comprises a first well formed in a substrate, the first well having an opposite conductive type from the substrate; a second well isolated from the first well, the second well having the same conductive type as the substrate; a field stop implant region formed between the first well and the second well and spaced apart from each of the first well and the second well by a given distance, the field stop implant region having the same conductive type as the substrate; and a pick-up region overlapped on the field stop implant region, the pick-up region having the same conductive type as the field stop implant region.

8 Claims, 2 Drawing Sheets

WELL STRUCTURE IN HIGH VOLTAGE DEVICE

BACKGROUND

1. Technical Field

A well structure in a high voltage device is disclosed which is capable of improving a well breakdown voltage (BVDSS) and preventing charge-up and latch-up at a substrate in the high voltage device used in a flash memory.

2. Discussion of the Related Art

In general, the flash memory is mainly classified into an NOR type and a NAND type depending on a shape in which memory cells are connected to bit lines. A high voltage is used in the NAND type flash memory or the NOR type flash memory in order to perform a program operation or an erase operation. In order for the NAND type flash memory to perform the program operation or the erase operation, a voltage of about 20V is required. Further, in order for the NOR type flash memory to perform the program operation or the erase operation, a voltage of about 14V is needed. In order to apply such high voltage to a cell region, a high voltage device is located in a peripheral circuit region.

In case of the NAND type flash memory, upon the program operation and the erase operation, a high voltage of about 20V is used as described above. Such a high voltage is obtained through a high voltage device. The high voltage device has a PMOS transistor and a native transistor within the N-well. As the N-well and N+ pickup are applied a high voltage, it is required that the well breakdown voltage of the N-well itself be about 30V. In other words, upon the program operation and the erase operation of the NAND type flash memory, in order for the high voltage device to stably apply the high voltage to the cell transistor, it is required that the well breakdown voltage of the high voltage device be 30V or higher. Even in case of the NOR type flash memory, it may well have a high well breakdown voltage even though its value may be different from that of the NAND type flash memory.

FIG. 1 is a cross-sectional view illustrating a basic well structure in a conventional high voltage device. In order to have a high well breakdown voltage, an N-well 12 is formed in a P type substrate 11 and a P-well 13 spaced apart from the N-well 12 by a given distance is formed in the P type substrate 11. In case of a structure in which the N-well 12 and the P-well 13 contact each other, the well breakdown voltage is about 18V. The high voltage device of this well structure could not be applied to devices that require the well breakdown voltage of 18V or higher, for example, the NAND type flash memory. Therefore, in case of the NAND type flash memory, the N-well 12 is separated by a distance of 20 μm or greater from the P-well 13 when it is formed in the P type substrate 11. In more detail, in the N-well 12 within the P type substrate 11, a lateral diffusion becomes about 1 μm, the depletion region is abruptly formed at a low voltage and the depletion region is not increased at a voltage of over a given value, i.e., due to a high resistance of the P type substrate 11. For this reason, a breakdown voltage of 40V or higher is kept at a distance of 20 μm or greater. As such, in case of the NAND flash memory, there occurs a problem where the high voltage device is formed by making the distance between the N-well 12 and the P-well 13 20 μm or greater. As the density of the NAND type flash memory recently becomes higher, it is required that the distance between the N-well 12 and the P-well 13 be narrowed. In order to solve this problem, in the NAND type flash memory of 0.12 μm level, field stop implant region 14 using boron is formed in the P type substrate 11 between the N-well 12 and the P-well 13. From a simulation shown in FIG. 3, however, it can be seen that the well breakdown voltage is low, about 23V, when the N-well 12 and the field stop implant region 14 are connected (0.0 μm). In FIG. 1, an unexplained reference numeral 15 indicates a field oxide film.

As described above, the conventional well structure in the high voltage device has limitations in higher-integration of the flash memory or the semiconductor device that requires the high well breakdown voltage.

SUMMARY

A well structure in a high voltage device is disclosed which is capable of improving performance and reliability of the device and realizing higher-integration of the device, by improving a well breakdown voltage and preventing charge-up and latch-up at a substrate.

A disclosed well structure comprises: a first well formed in a substrate, the first well having an opposite conductive type from the substrate; a second well isolated from the first well, the second well having the same conductive type as the substrate; a field stop implant region formed between the first well and the second well and spaced apart from each of the first well and the second well by a given distance, the field stop implant region having the same conductive type as the substrate; and a pick-up region overlapped on the field stop implant region, the pick-up region having the same conductive type as the field stop implant region.

In another embodiment, the substrate is a P type substrate.

In another embodiment, the first well is an N-well into which phosphorus (P) is implanted.

In another embodiment, the second well is a P-well into which boron (B) is implanted.

In another embodiment, the field stop implant region is formed by implanting boron (B).

In another embodiment, the spaced distance between the first well and the field stop implant region is in the range of 0.5 μm to 1.5 μm.

In another embodiment, the spaced distance between the second well and the field stop implant region is 0.5 to 1.5 μm.

In another embodiment, the pick-up region is formed by implanting boron (B) with a high concentration.

BRIEF DESCRIPTION OF THE DRAWINGS

The above and other features and advantages will become apparent from the following description of preferred embodiments given in conjunction with the accompanying drawings, wherein.

DETAILED DESCRIPTION OF PRESENTLY PREFERRED EMBODIMENTS

The disclosed well structure will now be described in detail in connection with preferred embodiments with reference to the accompanying drawings.

Figure 1:
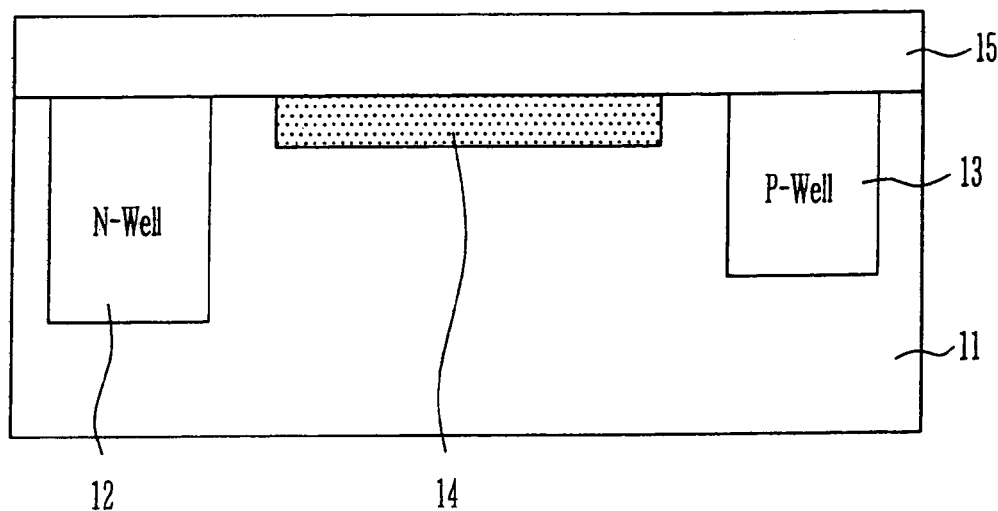
FIG. 1 is a cross-sectional view illustrating a basic well structure in a conventional high voltage device.
Figure 2:
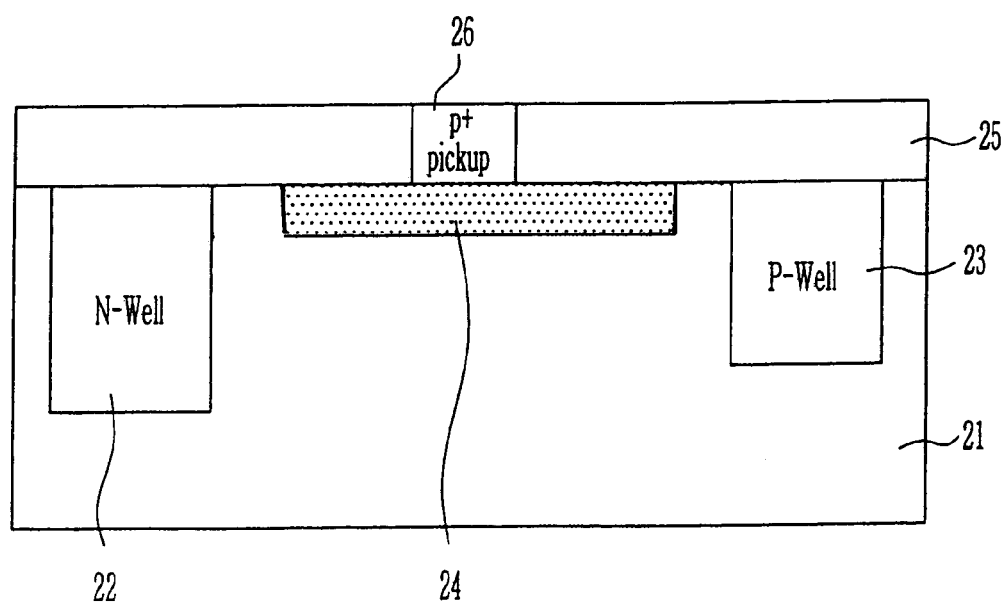
FIG. 2 is a cross-sectional view illustrating a disclosed well structure in a high voltage device.

FIG. 2 is a cross-sectional view illustrating a well structure in a disclosed high voltage device. The proposed well structure may be applied to a NAND type flash memory, an NOR type flash memory and all the semiconductor devices, which require a high voltage.

Referring to FIG. 2, a first well 22 is formed by implanting an impurity of a conductive type different than the substrate 21 into the substrate 21. A first transistor for a high voltage is contained in the first well 22 by means of a common process. A second well 23 is isolated from the first well 22 and is formed by implanting an impurity of the same conductive type as the substrate 21 into the substrate 21. A second transistor for a high voltage is contained in the second well 23 by means of a common process. A field stop implant region 24 is formed between the first well 22 and the second well 23 by implanting an impurity of the same conductive type as the substrate 21 into the substrate 21. At this time, the field stop implant region 24 is spaced apart from each of the first well 22 and the second well 23 by a given distance. A pick-up region 26 has the same conductive type to the field stop implant region 24 and is overlapped on the field stop implant region 24.

In a high voltage device, the substrate 21 is mainly a P type substrate. Therefore, the first well 22 becomes an N well by implanting the impurity of a conductive type different from the substrate 21, for example, phosphorus (P). Further, the second well 23 becomes a P well by implanting the impurity of the same conductive type as the substrate 21, for example, boron (B).

In the above, the field stop implant region 24 may be formed by implanting the impurity of the same conductive type as the substrate 21, for example boron (B) before a deposition process of HDP oxide for forming a field oxide film 25 after an ISO etch process in the process of manufacturing the flash memory, or may be formed by implanting boron (B) through additional process other than the process of manufacturing the flash memory.

Figure 3:
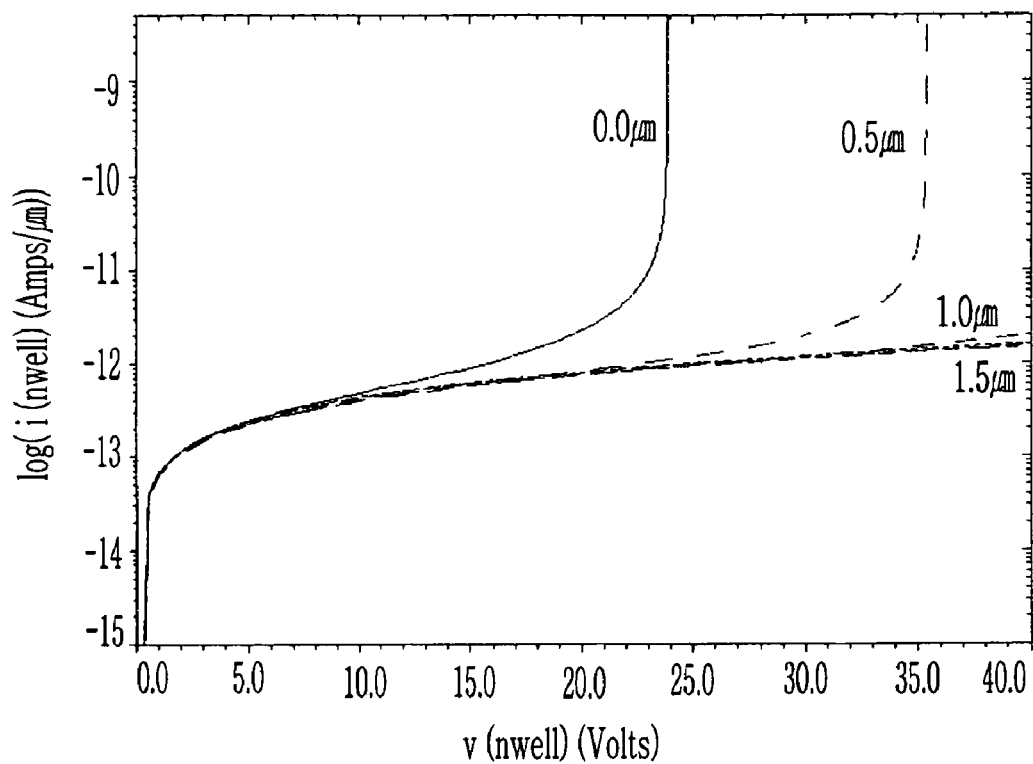
FIG. 3 illustrates a simulation result that an N-well breakdown voltage is measured while varying the distance between a field stop implant region and an N-well.

The field stop implant region 24 is spaced apart from the first well 22 which is the N-well by a given distance. This allows the phosphorus (P) of the first well 22 and the boron (B) of the field stop implant region 24 to avoid contact, thus improving the well breakdown voltage. FIG. 3 illustrates a simulation result that the N-well breakdown voltage is measured while varying the distance between the field stop implant region and the N-well in the NAND type flash memory of 0.12 $\mu$m level. It can be seen from FIG. 3 that the well breakdown voltage is about 23V when the distance between the field stop implant region 24 and the first well 22 is 0.0 $\mu$m. Further, it can be seen that, when the distance is 0.5 $\mu$m or greater, the N-well breakdown voltage of about 30V or higher can be obtained. Accordingly, in order to improve the well breakdown voltage of the high voltage device, the field stop implant region 24 is formed between the first well 22 and the second well 23, wherein the distance between the first well 22 and the field stop implant region 24 is spaced apart 0.5 $\mu$m or greater, preferably 0.5 to 1.5 $\mu$m.

Further, the field stop implant region 24 is spaced apart from the second well 23 which is the P-well by a given distance. This considers characteristics of the NMOS transistor formed in the second well 23 being the P-well. In the concrete, this is for reducing a body factor effect. The spaced distance needs not to be limited but may be set 0.5 $\mu$m or greater, preferably 0.5 to 1.5 $\mu$m.

The pick-up region 26 is formed by implanting the impurity of the same conductive type to the field stop implant region 24, for example, boron (B) with a high concentration. This is for preventing charge-up and latch-up at the P type substrate 21. In other words, as the resistance of the P type substrate 21 is high, charges may locally gather within the P type substrate 21. For this reason, a latch-up may occur and erroneous function may be caused. In order to prevent this, the pick-up region 26 is formed using the same conductive type impurity as the field stop implant region 24, e.g. boron (B).

The disclosed well structure can improve performance and reliability of a device and realize higher-integration of the device, by improving a well breakdown voltage and preventing charge-up and latch-up at a substrate.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A well structure in a high voltage device, comprising;
   a first well formed in a substrate, the first well having an implant of an opposite conductive type from the substrate;
   a second well isolated from the first well, the second well having an implant of the same conductive type as the substrate;
   a field stop implant region formed between the first well and the second well and spaced apart from each of the first well and the second well by a given distance, the field stop implant region having an implant of the same conductive type as the substrate; and
   a pick-up region disposed above the field stop implant region, the pick-up region having an implant of the same conductive type as the field stop implant region.

2. The well structure as claimed in claim 1, wherein the substrate is a P type substrate.

3. The well structure as claimed in claim 1, wherein the first well is an N-well into which phosphorus (P) is implanted.

4. The well structure as claimed in claim 1, wherein the second well is a P-well into which boron (B) is implanted.

5. The well structure as claimed in claim 1, wherein the field stop implant region is formed by implanting boron (B).

6. The well structure as claimed in claim 1, wherein the spaced distance between the first well and the field stop implant region is in the range of 0.5 $\mu$m to 1.5 $\mu$m.

7. The well structure as claimed in claim 1, wherein the spaced distance between the second well and the field stop implant region is 0.5 $\mu$m to 1.5 $\mu$m.

8. The well structure as claimed in claim 1, wherein the pick-up region is formed by implanting boron (B) with high concentration.

* * * * *